(12) United States Patent
Kunisch et al.

(10) Patent No.: US 11,474,160 B2
(45) Date of Patent: Oct. 18, 2022

(54) BATTERY EMULATION APPARATUS

(71) Applicant: Rohde & Schwarz GmbH & Co. KG, Munich (DE)

(72) Inventors: Sascha Kunisch, Haibach (DE); Philipp Weigell, Baierbrunn (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 135 days.

(21) Appl. No.: 16/996,134

(22) Filed: Aug. 18, 2020

(65) Prior Publication Data
US 2022/0057454 A1   Feb. 24, 2022

(51) Int. Cl.
| | |
|---|---|
| G01R 31/396 | (2019.01) |
| G01R 31/389 | (2019.01) |
| G01R 31/3832 | (2019.01) |
| G01R 31/319 | (2006.01) |

(52) U.S. Cl.
CPC ..... *G01R 31/396* (2019.01); *G01R 31/31917* (2013.01); *G01R 31/389* (2019.01); *G01R 31/3832* (2019.01)

(58) Field of Classification Search
None
See application file for complete search history.

(56) References Cited

U.S. PATENT DOCUMENTS

| | | | |
|---|---|---|---|
| 3,286,239 A | 11/1966 | Thompson | |
| 2016/0052418 A1* | 2/2016 | Yang | B60L 58/12 |
| | | | 180/65.265 |

FOREIGN PATENT DOCUMENTS

| | | |
|---|---|---|
| CN | 1773806 A | 5/2006 |
| CN | 101718849 A | 6/2010 |
| CN | 103279077 A | 9/2013 |
| CN | 203275628 U | 11/2013 |
| CN | 103954917 A | 7/2014 |
| CN | 203719914 U | 7/2014 |
| CN | 104035047 A | 9/2014 |
| CN | 104155616 A | 11/2014 |
| CN | 105115737 A | 12/2015 |
| CN | 105223505 A | 1/2016 |
| CN | 205015162 U | 2/2016 |
| CN | 105547712 A | 5/2016 |

(Continued)

*Primary Examiner* — Arun C Williams
(74) *Attorney, Agent, or Firm* — Potomac Technology Law, LLC

(57) ABSTRACT

A battery emulation apparatus for supplying a device-under-test (DUT) with electrical power, comprising output terminals for connecting the DUT and an output voltage module providing a variable DC output voltage. A user interface receives a user input comprising the setting of battery parameter(s) and measurement criteria. A data storage stores data representing battery models. A processor selects a battery model based on the parameter(s) and controls the output voltage module to emulate characteristics of the selected battery model(s) according the data, while supplying the DUT with the output voltage. The processor monitors a response of the DUT and/or the output voltage module to the emulated characteristics of the selected battery model(s), wherein the response comprises a physical measurement value. The processor evaluates said physical measurement value based on the set measurement criteria in order to assess the suitability of the selected model(s).

12 Claims, 2 Drawing Sheets

(56) References Cited

FOREIGN PATENT DOCUMENTS

| | | |
|---|---|---|
| CN | 105865804 A | 8/2016 |
| CN | 205450158 U | 8/2016 |
| CN | 106291060 A | 1/2017 |
| CN | 106597084 A | 4/2017 |
| CN | 106886003 A | 6/2017 |
| CN | 206470374 U | 9/2017 |
| CN | 206671454 U | 11/2017 |
| CN | 106374570 A | 12/2017 |
| CN | 107798164 A | 3/2018 |
| CN | 207409616 U | 5/2018 |
| CN | 207636302 U | 7/2018 |
| CN | 108550305 A | 9/2018 |
| CN | 108630074 A | 10/2018 |
| CN | 108648580 A | 10/2018 |
| CN | 108695570 A | 10/2018 |
| CN | 108919778 A | 11/2018 |
| CN | 109031155 A | 12/2018 |
| CN | 109034648 A | 12/2018 |
| CN | 109085504 A | 12/2018 |
| CN | 109507625 A | 3/2019 |
| CN | 109709415 A | 5/2019 |
| CN | 109814530 A | 5/2019 |
| CN | 209624692 U | 11/2019 |
| CN | 110618330 A | 12/2019 |
| CN | 209813763 U | 12/2019 |
| CN | 110824367 A | 2/2020 |
| CN | 210347800 U | 4/2020 |
| CN | 111221266 A | 6/2020 |
| EP | 1281621 A2 | 2/2003 |
| FR | 1317438 A | 2/1962 |
| FR | 1414774 A | 12/1963 |
| FR | 1521677 A | 3/1967 |
| FR | 2631168 A1 | 11/1989 |
| JP | H10144355 A | 5/1998 |
| RU | 2349518 C1 | 3/2009 |
| TW | 200613956 A | 5/2006 |
| WO | WO2011066540 A2 | 6/2011 |

\* cited by examiner

BATTERY EMULATION APPARATUS

TECHNICAL FIELD

The invention relates to the technical field of adaptive power supplies. In particular, the invention relates to a battery emulation apparatus and to a method for emulating batteries.

BACKGROUND

A power supply device supplies electrical power to a load. Many such power supply devices, in particular adaptive power supplies, allow a regulation of their output voltage and output current. Such devices can be used in laboratories or other development environments to supply variable power to the connected load, for example a devices-under-test (DUT).

Some power supply devices have a battery simulator function, which allow simulating the electrical characteristics of batteries with the power supply. The document WO 2011/066540 A2, for instance, discloses a dynamic battery emulator for replacing and mimicking the characteristics of a battery in a portable electronic device when the device is located in or on a vehicle. Thereby, the dynamic battery emulator varies its output voltage to adapt to the voltage requirements of an attached portable electronic device.

However, some users want to use such battery simulators to specifically simulate the output characteristics of different battery types, such as AG13, AAA, CR2032 or BR-A. In this way, for example, the response of a DUT to the simulated battery types can be tested. The DUT can be a new battery-powered product that is currently under development, for which it has to be decided which type of battery is used in the end product.

However, in order to adjust a power supply to simulate certain existing battery types, a user typically has to set many different parameters with high accuracy. A small deviation in these parameters may lead to an inaccurate simulation of a battery type. Often, the user has to look up these parameters in the literature or on the internet, which is cumbersome, especially if multiple battery types are simulated successively.

Thus, it is an objective to provide an improved test system, an improved battery emulation apparatus and an improved method for emulating batteries, which avoid the above-mentioned disadvantages.

SUMMARY

Embodiments of the present invention advantageously address the foregoing requirements and needs, as well as others, by providing an improved test system, an improved battery emulation apparatus and an improved method for emulating batteries, which avoid the above-mentioned disadvantages.

The object of the present invention is achieved by the solution provided in the enclosed independent claims. Advantageous implementations of the present invention are further defined in the dependent claims.

According to a first aspect, the invention relates to a battery emulation apparatus for supplying a device under test (DUT) with electrical power, comprising output terminals for connecting the DUT to the battery emulation apparatus; an output voltage module configured to provide a variable DC output voltage to the DUT; a user interface configured to receive a user input, wherein the user input comprises the setting of at least one battery parameter and at least one measurement criteria; a data storage configured to store data representing a plurality of battery models; and a processor configured to select at least one battery model from the data storage based on the set battery parameter; wherein the processor is configured to control the output voltage module to emulate characteristics of the at least one selected battery model according the stored data, while supplying the DUT with the output voltage; wherein the processor is configured to monitor a response of the DUT and/or the output voltage module to the emulated characteristics of the at least one selected battery model, wherein the response comprises at least one physical measurement value; and wherein the processor is configured to evaluate said physical measurement value based on the set measurement criteria in order to assess the suitability of the at least one selected battery model for the DUT.

This achieves the advantage that that the suitability of various battery models for use as a power supply of the DUT can be evaluated efficiently. In particular, a user of the battery emulation apparatus does not have to adjust the output characteristics of the battery simulation apparatus to each battery model to be tested. Instead, the user only needs to provide certain battery parameters, e.g. a supply voltage, and the apparatus autonomously emulates suitable battery models, which fit to the set battery parameters. This simplifies the operation of the apparatus and prevents input errors.

Preferably, the battery emulation apparatus is a power supply, in particular an adaptive power supply, which is set to a battery emulation mode. The adaptive power supply in the battery emulation mode can form a battery simulator. Optionally, the adaptive power supply can be set to alternative modes. For example, in an alternative mode, the adaptive power supply provides DC or AC output currents and/or voltages that are directly adjustable by the user via the user interface.

The battery emulation apparatus may comprise a mains power connector, which is connectable to a mains power supply and configured to receive a mains voltage. The output voltage module can comprise a converter, which is configured to convert the received mains voltage into the DC output voltage that is supplied to the DUT. The output voltage module can further comprise a controller for controlling the operation of the converter, in particular to emulate the battery models. The output voltage module can further be configured to provide a DC output current to the DUT.

Preferably, the emulation of the at least one battery model by the output voltage module comprises a simulation of said at least one battery model.

The DUT can be a battery powered device, such as a laptop, a tablet, a smartphone, a radio, a measuring instrument or a component thereof. Preferably, the suitability of the at least one selected battery model for the DUT refers to how suitable the respective battery model is as a DC power supply of the DUT. The suitability is, for instance, defined based the lowest possible heat generation at the DUT or the battery.

The physical measurement value is preferably a non-electrical physical value, e.g. a temperature.

In an embodiment, the at least one battery model selected by the processor comprises two or more battery models, wherein the processor is configured to determine, which of the selected two or more battery models is more suitable for the DUT based on the evaluation of the respective physical measurement value for each of the two or more battery models. This achieves the advantage that several emulated battery models as power supply of the DUT can be compared and the most suitable one can be identified.

In an embodiment, the battery emulation apparatus comprises a sensor unit, which is configured to detect the physical measurement value, wherein the sensor unit is further configured to forward said physical measurement value to the processor. This achieves the advantage that the physical measurement value can be detected efficiently.

Preferably, the sensor unit is an external sensor, e.g. a probe head. For example, the sensor unit is attached to or connected to the DUT in order to detect the physical measurement value.

In an embodiment, the sensor unit is a temperature sensor, and the physical measurement value is a temperature, preferably of the DUT.

In an embodiment, the measurement criteria is a minimum heating of the output voltage module and/or a minimum DUT heating. This achieves the advantage that the suitability of a battery module for powering the DUT can be determined on the basis of a heating it causes on the DUT or the emulated battery. For instance, some emulated battery models can cause an overheating of the DUT and/or the output voltage module and are therefore not suitable for powering the DUT.

Preferably, the lower the heating of the DUT and/or the voltage output module, the more suitable is the respective battery model for the DUT.

In an embodiment, the measurement criteria comprises a physical target value, e.g. a target temperature, wherein the processor is configured to compare the physical measurement value to the physical target value. This achieves the advantage that the suitability of a battery model can be determined efficiently.

In particular, the closer the physical measurement value to the target value, the more suitable is the respective battery model for the DUT.

In an embodiment, each battery model is at least partially defined by an electrical output characteristic, in particular a current and/or a voltage characteristic, wherein the processor is configured to control the output voltage module to emulate the electrical output characteristic of the at least one selected battery model. This achieves the advantage that a battery model can be emulated/simulated efficiently.

In an embodiment, the selected battery parameter comprises a voltage or a temperature.

In an embodiment, the data representing the plurality of battery models comprises for each stored battery model at least one of the following parameters: a cell voltage, a cell capacity, an internal resistance and/or an internal impedance.

All the above-mentioned embodiments and/or optional features of the battery emulation apparatus can be combined.

According to a second aspect, the invention relates to a method for emulating batteries with a battery emulation apparatus, which comprises an output voltage module configured to provide a variable electrical output voltage to a device under test (DUT), wherein the method comprises the steps: receiving a user input via a user interface of the battery emulation apparatus, wherein the user input comprises the setting of at least one battery parameter and at least one measurement criteria; selecting at least one battery model from a data storage of the battery emulation apparatus based on the selected battery parameter; controlling the output voltage module to emulate characteristics of the at least one selected battery model according to the stored data, while supplying the DUT with the output voltage; monitoring a response of the DUT and/or the output voltage module to the emulated characteristics of the at least one selected battery model, wherein the response comprises at least one physical measurement value; and evaluating said physical measurement value based on the set measurement criteria in order to assess the suitability of the at least one selected battery model for the DUT.

This achieves the advantage that that the suitability of various battery models for use as a power supply of the DUT can be evaluated efficiently. In particular, a user of the battery emulation apparatus does not have to adjust the output characteristics of the battery simulation apparatus to each battery model to be tested. Instead, the user only needs to provide certain battery parameters, e.g. a supply voltage, and the apparatus autonomously emulates suitable battery models, which fit to the set battery parameters. This simplifies the operation of the apparatus and prevents input errors.

In an embodiment, the at least one battery model selected by the processor comprises two or more battery models, wherein the method further comprises the step of: determining which of the selected two or more battery models is most suitable for the DUT based on the evaluation of the respective physical measurement value for each of the two or more battery models. This achieves the advantage that several battery models can be compared and the most suitable one for the DUT can be identified.

In an embodiment, the method further comprises the step of detecting the physical measurement value with a sensor unit of the battery emulation apparatus. This achieves the advantage that the physical measurement value can be detected efficiently.

In an embodiment, the physical measurement value is a temperature, preferably of the DUT.

In an embodiment, the measurement criteria is a minimum heating of the output voltage module and/or a minimum DUT heating. This achieves the advantage that the suitability of a battery module for powering the DUT can be determined on the basis of a heating it causes on the DUT or the emulated battery. For instance, some emulated battery models can cause an overheating of the DUT and/or the output voltage module.

In an embodiment, the measurement criteria comprises a physical target value, e.g. a target temperature, wherein the processor is configured to compare the physical measurement value to the physical target value. The achieves the advantage that the suitability of a battery model can be determined efficiently.

In an embodiment, the selected battery parameter comprises a voltage or a temperature.

All the above-mentioned embodiments and/or optional features of the method for emulating batteries can be combined.

The above description with regard to the battery emulation apparatus according to the first aspect of the invention is correspondingly valid for the method for emulating batteries according to the second aspect of the invention.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

Exemplary embodiments of the invention are now further explained with respect to the drawings by way of example only, and not for limitation. In the drawings.

DETAILED DESCRIPTION

An improved test system, an improved battery emulation apparatus and an improved method for emulating batteries, which avoid the above-mentioned disadvantages, are provided. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

A processor, unit, module or component (as referred to herein) may be composed of software component(s), which are stored in a memory or other computer-readable storage medium, and executed by one or more processors or CPUs of the respective devices. A module or unit may alternatively be composed of hardware component(s) or firmware component(s), or a combination of hardware, firmware and/or software components. Further, with respect to the various example embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention. Moreover, the methods, processes and approaches described herein may be processor-implemented using processing circuitry that may comprise one or more microprocessors, application specific integrated circuits (ASICs), field programmable gate arrays (FPGAs), or other devices operable to be configured or programmed to implement the systems and/or methods described herein. For implementation on such devices that are operable to execute software instructions, the flow diagrams and methods described herein may be implemented in processor instructions stored in a computer-readable medium, such as executable software stored in computer memory storage.

Figure 1:
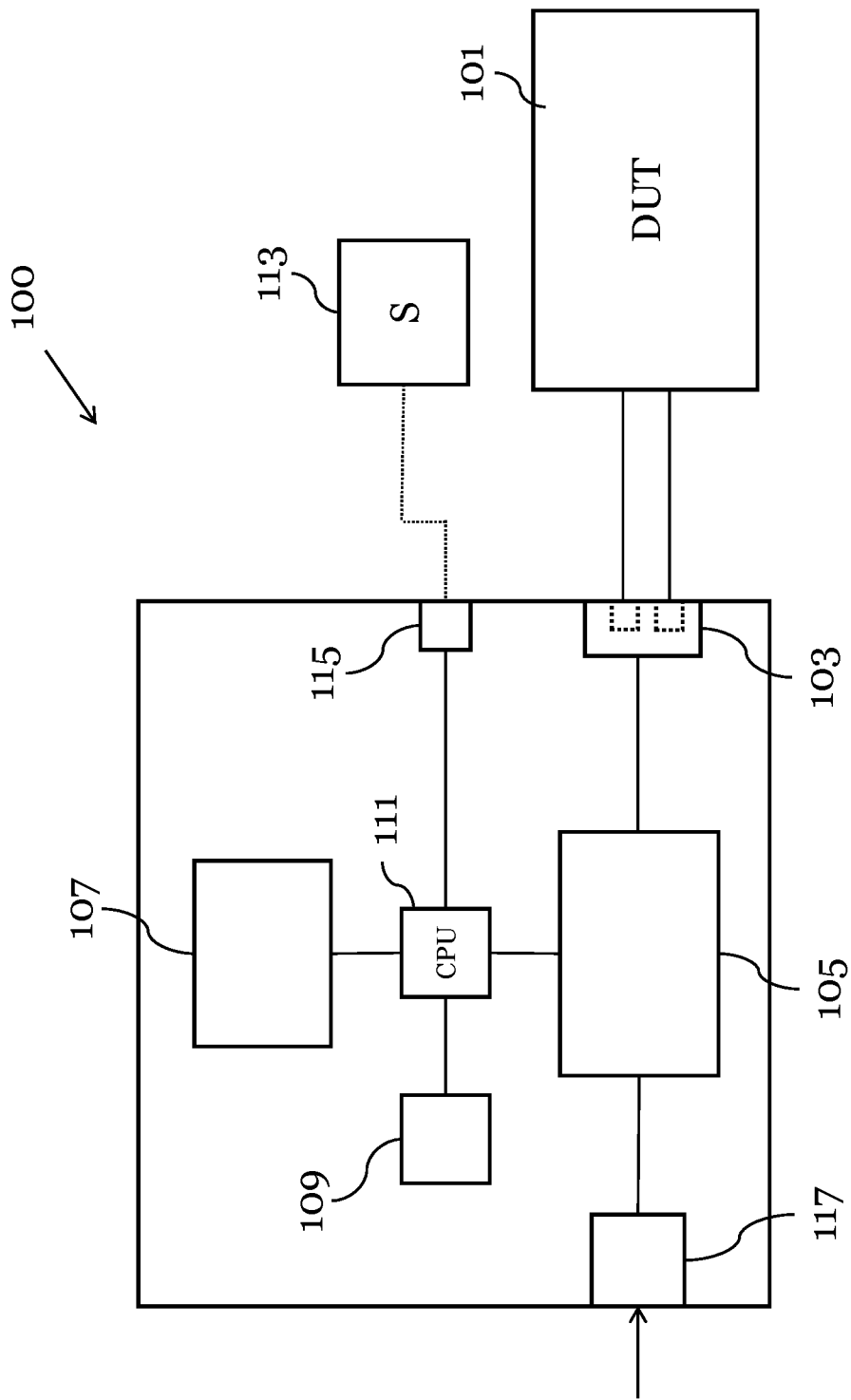
FIG. 1 shows a schematic diagram of a battery emulation apparatus according to an embodiment.

FIG. 1 shows a schematic diagram of a battery emulation apparatus 100 according to an embodiment. The battery emulation apparatus 100 is configured to supply a DUT 101 with electrical power, in particular a DC output voltage.

The battery emulation apparatus 100 comprises output terminals 103 for connecting the DUT 101 to the battery emulation apparatus 100, an output voltage module 105 configured to provide a variable DC output voltage to the DUT 101, a user interface 107 configured to receive a user input, wherein the user input comprises the setting of at least one battery parameter and at least one measurement criteria, and a data storage 109 configured to store data representing a plurality of battery models. The battery emulation apparatus 100 further comprises a processor 111 configured to select at least one battery model from the data storage 109 based on the set battery parameter, wherein the processor is configured to control the output voltage module 105 to emulate characteristics of the at least one selected battery model according the stored data, while supplying the DUT 101 with the output voltage.

Preferably, the processor 111 is configured to monitor a response of the DUT 101 and/or the output voltage module 105 to the emulated characteristics of the at least one selected battery model, wherein the response comprises at least one physical measurement value. In particular, the processor 111 is configured to evaluate said physical measurement value based on the set measurement criteria in order to assess the suitability of the at least one selected battery model for the DUT 101.

The output terminals 103 can comprise two connectors for connecting the DUT, in particular a plus and a minus connector.

The DUT 101 can be a battery powered device, such as a laptop, a tablet, a smartphone, a radio, a measuring instrument or a component thereof. The DUT 101 can have connectors for connecting the DUT 101 to the output terminals 103 of the battery emulation apparatus 100 via electrical cables. The connectors of the DUT 101 can be configured to receive a supply voltage for powering the DUT 101.

The battery emulation apparatus 100 may comprise a mains power connector 117, which is configured to receive a mains voltage from a mains power supply. The mains power connector 117 can be configured to forward said mains voltage to the output voltage module 105. The output voltage module 105 can comprise or form a converter for converting the mains voltage into a variable DC voltage. The output voltage module may further comprise a controller for controlling the operation of the converter, in particular for adjusting a level of the output voltage of the converter. The controller can be configured to controlling the operation of the converter based on signals received from the processor 111.

The processor 111 can be a processing unit, such as a microprocessor of the battery emulation apparatus 100. Preferably, the processor 111 is configured to control further functions of the battery emulation apparatus 100. In particular, the processor 111 is configured to control the output voltage module 105 to provide a specific output voltage or current according to a user input, e.g. if a user directly sets said output voltage or current via the user interface 107. Further, the processor 111 can be configured to control the output voltage module 105 to emulate the battery models at different charging states.

The user interface 107 can comprise a touchscreen, wherein the user input can be touch gesture on the touchscreen. The user interface 107 can further or alternatively comprise hard and/or soft buttons on the apparatus 100.

Preferably, the user interface 107 provides a text box or a drop down list to set the at least one battery parameter and at least one measurement criteria. The user may also directly select battery models on the text box or the drop down list.

The battery parameter can be a voltage and/or a temperature value. The voltage may refer to an output voltage that can be provided by a battery, e.g. 3.7 V, and the temperature to a maximum or an average temperature, to which the battery heats up during use, e.g. 35° C. Preferably, the at least one battery parameter that is set by the user corresponds to requirement data, i.e. data comprising parameters that an emulated battery needs to be able to provide.

The data storage 109 can be a memory, such as a flash memory. The memory can be configured to store the plurality of battery models in the form of a look-up-table and/or a database of said battery models.

Preferably, each battery model is at least partially defined by an electrical output characteristic. The processor 111 can be configured to control the output voltage module 105 to emulate the electrical output characteristic of the at least one selected battery model. This achieves the advantage that the electrical characteristics of a real life battery can be simulated by the battery emulation apparatus 100.

In particular, the plurality of battery models are stored in the data storage 109 in the form of datasets for each battery model. The dataset of each battery model can comprise the following parameters that are associated with the battery model: a cell voltage, a cell capacity, an internal resistance and/or an internal impedance. In particular, these parameters correspond to model data of the battery model. The parameters stored for each battery model can correspond to battery model data. The processor 111 can be configured to control the output voltage module 105 to emulate/simulate a DC voltage source with said parameters/model data.

The battery models stored in the data storage 109 can correspond to real battery types, such as AG13, AAA, CR2032 or BR-A.

Optionally, the battery emulation apparatus comprises a communication interface (not shown) for connecting the apparatus to an external network, e.g. a cloud network and/or the internet. The data storage 109 can be configured to download further battery models from the external network. This achieves the advantage that the battery emulation apparatus 100 can be updated and further battery models can be added.

Preferably, the processor selects two or more battery models from the data storage 109 based on the set battery parameter, and controls the output voltage module to subsequently emulate characteristics of the two or more selected battery models according the stored data, while supplying the DUT with the output voltage. The processor can be configured to determine, which of the selected two or more battery models is more suitable for the DUT 101 based on the evaluation of the respective physical measurement value for each of the two or more selected battery models. In this way, the battery emulation apparatus 100 can compare the response to different emulated battery models and decide, which one is the most suitable model.

The battery emulation apparatus can comprise a sensor unit 113. The sensor unit 113 can be configured to detect the physical measurement value, and to forward said physical measurement value to the processor 111.

As depicted in FIG. 1, the sensor unit 113 can be an external sensor, e.g. a probe head. The battery emulation apparatus 100 can comprise a sensor interface 115 for connecting the probe head and to transferrin the physical measurement values.

The sensor unit 113 can be a temperature sensor, which is configured to measure a temperature change of the DUT 101 in response to the emulated characteristics of the at least one battery model.

Alternatively, the battery emulation apparatus can comprise an internal sensor unit, configured to detect a temperature change of the output voltage module 105 in response to the emulated characteristics of the at least one battery model. Preferably, measuring the temperature of the output voltage module 105 during a battery emulation, allows drawing conclusions on the temperature behavior of the corresponding real life battery, when used to power the DUT 101.

The measurement criteria can comprise a minimum heating of the DUT 101 and/or the output voltage module. In this case, the processor 111 can be configured to determine the emulated battery model, which causes the least heating of the DUT 101 and/or the output voltage module, as the most suitable battery model for the DUT 101. This allows to determine which batteries prevent an overheating when used as energy source for the DUT 101.

The measurement criteria can also comprise a maximum operation time of the DUT 101 and the physical measurement value can be a time period for which the DUT can be operated with the respective emulated battery model. In this case, the processor 111 can be configured to control the output voltage module 105 to emulate the at least one battery model with a limited charge, which decreases over time. The processor can then assess the suitability of the at least one emulated battery model based on how long the DUT 101 can be operated with the battery model, wherein the longer the operating time of the DUT 101, the more suitable the emulated battery model. If two or more battery models are emulated, the processor can be configured to compare the operating times with each battery model and determine the most suitable battery model based on the longest operating time.

Alternatively, the measurement criteria can comprise a target value, e.g. a target temperature, a target time period or other target data. The processor 111 can be configured to compare the physical measurement value to the physical target value and to determine the emulated battery model with the smallest deviation from the target value as the most suitable battery model for the DUT 101.

Figure 2:
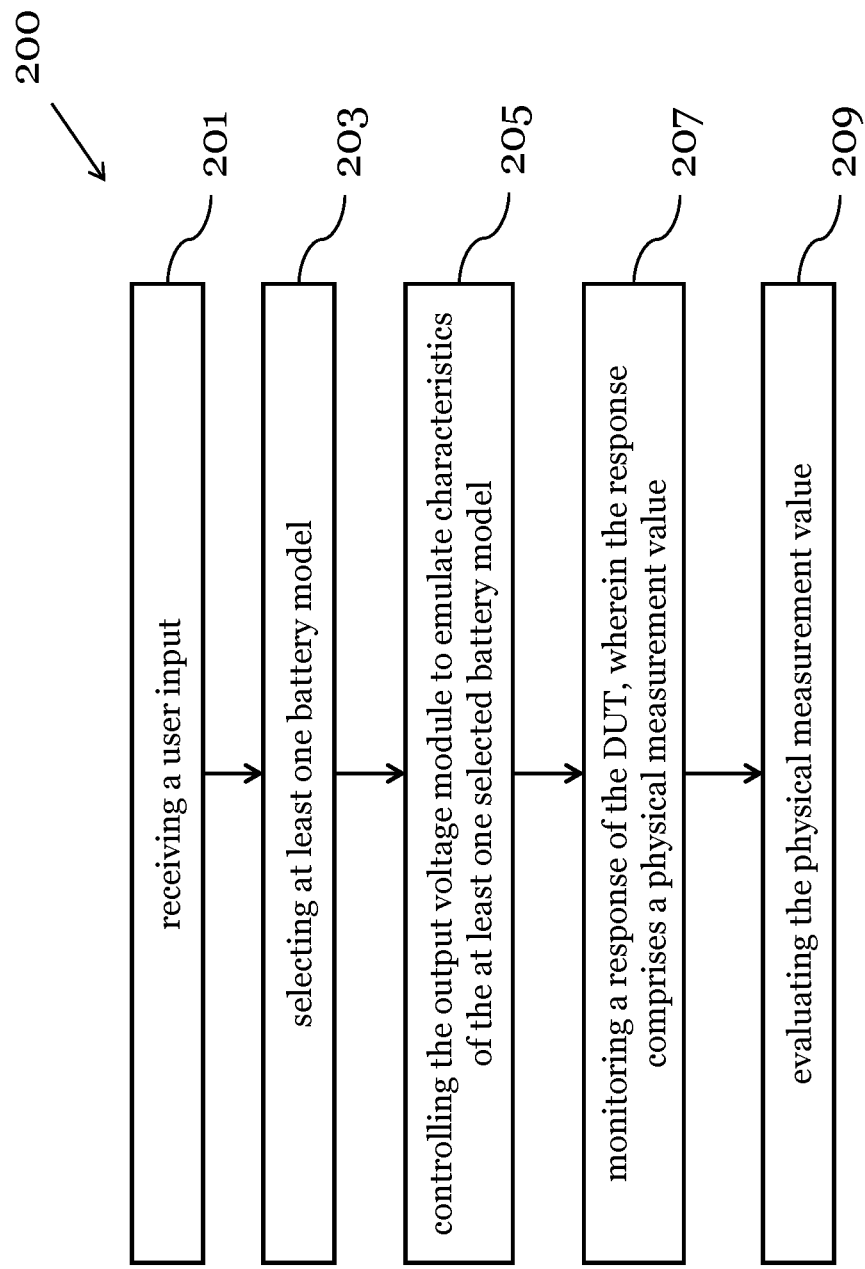
FIG. 2 shows a schematic diagram of a method for emulating batteries according to an embodiment.

FIG. 2 shows a schematic diagram of a method 200 for emulating batteries according to an embodiment. Preferably, the method 200 is performed with the battery emulation apparatus 100 shown in FIG. 1, which comprises an output voltage module 105 configured to provide the variable electrical output voltage to the DUT 101.

The method 200 comprises the steps of: receiving 201 a user input via the user interface 107 of the battery emulation apparatus 100, wherein the user input comprises the setting of at least one battery parameter and at least one measurement criteria; selecting 203 at least one battery model from the data storage 109 of the battery emulation apparatus 100 based on the selected battery parameter; controlling 205 the output voltage module 105 to emulate characteristics of the at least one selected battery model according the stored data, while supplying the DUT 101 with the output voltage; monitoring 207 a response of the DUT 101 and/or the output voltage module 105 to the emulated characteristics of the at least one selected battery model, wherein the response comprises at least one physical measurement value; and evaluating 209 said physical measurement value based on the set measurement criteria in order to assess the suitability of the at least one selected battery model for the DUT 101.

Preferably, the steps of selecting 203 the at least one battery model, controlling 205 the output voltage module 105, monitoring 207 the response, and evaluating 209 the physical measurement values are carried out by the processor 111 of the battery evaluation apparatus 100.

Preferably, the at least one battery model selected by the processor 111 comprises two or more battery models. In this case, the method 200 further comprises the step of: determining which of the selected two or more battery models is most suitable for the DUT 101 based on the evaluation of the respective physical measurement value for each of the two or more battery models.

Preferably, the method comprises the step of detecting the physical measurement value with the sensor unit 113 of the battery emulation apparatus 100.

The selected battery parameter set by the user can comprise a voltage or a temperature, and the physical measurement value can be a temperature, preferably of the DUT 101.

The measurement criteria can be a minimum heating of the output voltage module 105 and/or a minimum DUT 101 heating. The measurement criteria can further or additionally comprise a physical target value, e.g. a target temperature, wherein the processor 111 is configured to compare the physical measurement value to the physical target value.

All features of all embodiments described, shown and/or claimed herein can be combined with each other.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A battery emulation apparatus for supplying a device under test (DUT) with electrical power, comprising:
    output terminals for connecting the DUT to the battery emulation apparatus;
    an output voltage module configured to provide a variable DC output voltage to the DUT;
    an interface configured to receive input data comprising at least one battery parameter and at least one measurement criteria;
    a data storage configured to store data representing a plurality of battery models;
    a temperature sensor configured to detect a temperature of the DUT; and
    a processor configured to select at least one battery model from the data storage based on the at least one battery parameter; and
    wherein the processor is configured to control the output voltage module to emulate characteristics of the at least one selected battery model according the stored data, while supplying the DUT with the output voltage,
    wherein the processor is configured to monitor a response of the DUT and/or the output voltage module to the emulated characteristics of the at least one selected battery model, wherein the response comprises at least one physical measurement value including the temperature of the DUT,
    wherein the processor is configured to evaluate the at least one physical measurement value including the temperature of the DUT based on the measurement criteria in order to assess the suitability of the at least one selected battery model for the DUT.

2. The battery emulation apparatus of claim 1, wherein the at least one battery model selected by the processor comprises two or more battery models, wherein the processor is configured to determine which of the selected two or more battery models is more suitable for the DUT based on the evaluation of the at least one physical measurement value including the temperature of the DUT for each of the two or more battery models.

3. The battery emulation apparatus of claim 1, wherein the at least one measurement criteria comprises a minimum heating of the output voltage module and/or a minimum heating of the DUT.

4. The battery emulation apparatus of claim 1, wherein the measurement criteria comprises a physical target value, wherein the processor is configured to compare the physical measurement value to the physical target value.

5. The battery emulation apparatus of claim 1, wherein each battery model is at least partially defined by one or more electrical output characteristics, including a current and/or a voltage characteristic, wherein the processor is configured to control the output voltage module to emulate the electrical output characteristic of the at least one selected battery model.

6. The battery emulation apparatus of claim 1, wherein the selected battery parameter comprises a voltage or a temperature.

7. The battery emulation apparatus of claim 1, wherein the data representing the plurality of battery models comprises for each stored battery model at least one of the following parameters: a cell voltage, a cell capacity, an internal resistance and/or an internal impedance.

8. A method for emulating batteries with a battery emulation apparatus, which is configured to provide a variable electrical output voltage to a device under test (DUT), wherein the method comprises the steps:
    receiving input data via an interface of the battery emulation apparatus, wherein the input data comprises at least one battery parameter and at least one measurement criteria;
    selecting, by a processor of the battery emulation apparatus, at least one battery model from a data storage of the battery emulation apparatus based on the at least one battery parameter;
    controlling, by the processor, an output voltage module of the battery emulation apparatus to emulate characteristics of the selected at least one battery model according the stored data, while supplying the DUT with the output voltage;
    detecting a temperature of the DUT via a temperature sensor of the battery emulation apparatus;
    monitoring, by the processor, a response of the DUT and/or the output voltage module to the emulated characteristics of the at least one selected battery model, wherein the response comprises at least one physical measurement value including the temperature of the DUT; and
    evaluating, by the processor, the at least one physical measurement value including the temperature of the DUT based on the measurement criteria in order to assess the suitability of the at least one selected battery model for the DUT.

9. The method of claim 8, wherein the at least one battery model selected by the processor comprises two or more battery models, wherein the method further comprises the step of:
    determining which of the selected two or more battery models is more suitable for the DUT based on the evaluation of the at least one physical measurement value including the temperature of the DUT for each of the two or more battery models.

10. The method of claim 8, wherein the measurement criteria comprises a minimum heating of the output voltage module and/or a minimum heating of the DUT.

11. The method of claim 8, wherein the measurement criteria comprises a physical target value, wherein the processor is configured to compare the physical measurement value to the physical target value.

12. The method of claim 8, wherein the selected battery parameter comprises a voltage or a temperature.

* * * * *